United States Patent
Carlson et al.

(10) Patent No.: US 8,663,390 B2
(45) Date of Patent: Mar. 4, 2014

(54) INDEPENDENT RADIANT GAS PREHEATING FOR PRECURSOR DISASSOCIATION CONTROL AND GAS REACTION KINETICS IN LOW TEMPERATURE CVD SYSTEMS

(75) Inventors: David Keith Carlson, San Jose, CA (US); Satheesh Kuppurao, San Jose, CA (US); Howard Beckford, San Jose, CA (US); Herman Diniz, Fremont, CA (US); Kailash Kiran Patalay, Santa Clara, CA (US); Brian Hayes Burrows, San Jose, CA (US); Jeffrey Ronald Campbell, San Francisco, CA (US); Zouming Zhu, Santa Clara, CA (US); Xiaowei Li, Austin, TX (US); Errol Antonio Sanchez, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 151 days.

(21) Appl. No.: 13/175,499

(22) Filed: Jul. 1, 2011

(65) Prior Publication Data

US 2011/0259432 A1    Oct. 27, 2011

Related U.S. Application Data

(62) Division of application No. 11/937,388, filed on Nov. 8, 2007, now Pat. No. 7,976,634.

(60) Provisional application No. 60/866,799, filed on Nov. 21, 2006.

(51) Int. Cl.
| | | |
|---|---|---|
| C23C 16/452 | (2006.01) | |
| C23C 16/46 | (2006.01) | |
| C23F 1/00 | (2006.01) | |
| H01L 21/306 | (2006.01) | |
| C23C 16/02 | (2006.01) | |
| C23C 16/06 | (2006.01) | |

(52) U.S. Cl.
USPC .................................. 118/724; 156/345.1

(58) Field of Classification Search
USPC .................................. 118/724; 156/345.1
See application file for complete search history.

(56) References Cited

U.S. PATENT DOCUMENTS

| 4,047,496 A | * | 9/1977 | McNeilly et al. | ............. 118/725 |
| 4,081,313 A | * | 3/1978 | McNeilly et al. | ............. 117/103 |

(Continued)

FOREIGN PATENT DOCUMENTS

| JP | 61279120 A | * | 12/1986 | ............. H01L 21/205 |
| JP | 62174923 A | * | 7/1987 | ............. H01L 21/316 |

(Continued)

OTHER PUBLICATIONS

Webster's On-Line Dictionary Ref.*

(Continued)

*Primary Examiner* — Rudy Zervigon
(74) *Attorney, Agent, or Firm* — Patterson & Sheridan, LLP

(57) ABSTRACT

A method and apparatus for delivering precursor materials to a processing chamber is provided. In one embodiment, a deposition apparatus is provided. The apparatus includes a chamber having a longitudinal axis, and a gas distribution assembly coupled to a sidewall of the chamber. The gas distribution assembly comprises a plurality of plenums coupled to one or more gas sources, an energy source positioned to provide energy to each of the plurality of plenums, and a variable power source coupled to the energy source, wherein the gas distribution assembly provides a flow path through the chamber that is normal to the longitudinal axis of the chamber.

21 Claims, 6 Drawing Sheets

(56) References Cited

U.S. PATENT DOCUMENTS

| | | | |
|---|---|---|---|
| 4,913,929 A | 4/1990 | Moslehi et al. | |
| 5,005,519 A * | 4/1991 | Egermeier et al. | 118/722 |
| 5,108,792 A | 4/1992 | Anderson et al. | |
| 5,149,375 A * | 9/1992 | Matsuyama | 118/719 |
| 5,155,336 A * | 10/1992 | Gronet et al. | 219/411 |
| 5,179,677 A * | 1/1993 | Anderson et al. | 392/411 |
| 5,215,588 A * | 6/1993 | Rhieu | 118/715 |
| 5,244,501 A * | 9/1993 | Nakayama et al. | 118/725 |
| 5,252,132 A * | 10/1993 | Oda et al. | 118/725 |
| 5,252,366 A * | 10/1993 | Ahern et al. | 427/557 |
| 5,269,847 A * | 12/1993 | Anderson et al. | 118/715 |
| 5,305,417 A * | 4/1994 | Najm et al. | 392/418 |
| 5,310,260 A | 5/1994 | Schietinger et al. | |
| 5,364,667 A * | 11/1994 | Rhieu | 427/582 |
| 5,455,070 A * | 10/1995 | Anderson et al. | 427/248.1 |
| 5,458,918 A * | 10/1995 | Hawkins et al. | 427/248.1 |
| 5,482,739 A | 1/1996 | Hey et al. | |
| 5,493,987 A * | 2/1996 | McDiarmid et al. | 117/102 |
| 5,650,082 A * | 7/1997 | Anderson | 219/390 |
| 5,689,614 A * | 11/1997 | Gronet et al. | 392/416 |
| 5,781,693 A * | 7/1998 | Ballance et al. | 392/416 |
| 5,790,750 A * | 8/1998 | Anderson | 392/416 |
| 5,892,886 A * | 4/1999 | Sandhu | 392/416 |
| 5,900,177 A * | 5/1999 | Lecouras et al. | 219/497 |
| 5,916,369 A * | 6/1999 | Anderson et al. | 118/715 |
| 5,937,142 A * | 8/1999 | Moslehi et al. | 392/416 |
| 5,960,158 A * | 9/1999 | Gat et al. | 392/416 |
| 6,037,273 A | 3/2000 | Gronet et al. | |
| 6,064,800 A * | 5/2000 | Sandhu | 392/416 |
| 6,108,490 A * | 8/2000 | Lee et al. | 392/416 |
| 6,121,579 A * | 9/2000 | Aoki et al. | 219/390 |
| 6,122,439 A * | 9/2000 | Gronet et al. | 392/416 |
| 6,122,440 A * | 9/2000 | Campbell | 392/420 |
| 6,159,866 A | 12/2000 | Gronet et al. | |
| 6,167,195 A * | 12/2000 | Moslehi et al. | 392/418 |
| 6,232,580 B1 * | 5/2001 | Sandhu | 219/390 |
| 6,281,141 B1 * | 8/2001 | Das et al. | 438/770 |
| 6,342,421 B1 | 1/2002 | Mitani et al. | |
| 6,352,593 B1 * | 3/2002 | Brors et al. | 118/724 |
| 6,352,594 B2 * | 3/2002 | Cook et al. | 118/724 |
| 6,375,750 B1 * | 4/2002 | van Os et al. | 118/728 |
| 6,476,362 B1 * | 11/2002 | Deacon et al. | 219/390 |
| 6,482,739 B2 | 11/2002 | Wu et al. | |
| 6,500,734 B2 * | 12/2002 | Anderson et al. | 438/478 |
| 6,527,865 B1 | 3/2003 | Sajoto et al. | |
| 6,566,630 B2 * | 5/2003 | Kitamura | 219/390 |
| 6,576,565 B1 * | 6/2003 | Chakravarti et al. | 438/758 |
| 6,614,181 B1 | 9/2003 | Harvey et al. | |
| 6,703,321 B2 | 3/2004 | Geiger et al. | |
| 6,814,811 B2 * | 11/2004 | Ose | 118/715 |
| 6,846,364 B2 * | 1/2005 | Pyo | 118/725 |
| 6,891,131 B2 * | 5/2005 | Sakuma et al. | 219/390 |
| 6,900,133 B2 | 5/2005 | Chinn et al. | |
| 6,951,827 B2 | 10/2005 | Utz et al. | |
| 6,972,228 B2 | 12/2005 | Doyle et al. | |
| 7,118,781 B1 * | 10/2006 | Sumakeris et al. | 427/248.1 |
| 7,196,283 B2 * | 3/2007 | Buchberger et al. | 219/121.43 |
| 7,608,802 B2 * | 10/2009 | Gat et al. | 219/390 |
| 7,704,898 B2 * | 4/2010 | Nenyei et al. | 438/795 |
| 7,709,391 B2 * | 5/2010 | Kuppurao et al. | 438/706 |
| 7,722,737 B2 * | 5/2010 | Gondhalekar et al. | 156/345.33 |
| 7,749,326 B2 * | 7/2010 | Kim et al. | 118/715 |
| 7,772,527 B2 * | 8/2010 | Choi | 219/405 |
| 7,794,667 B2 * | 9/2010 | Nishikawa et al. | 422/129 |
| 7,806,078 B2 * | 10/2010 | Yoshida | 118/723 I |
| 7,972,441 B2 * | 7/2011 | Yokota et al. | 118/715 |
| 7,976,634 B2 * | 7/2011 | Carlson et al. | 118/724 |
| 8,277,561 B2 * | 10/2012 | Kim et al. | 118/715 |
| 8,298,338 B2 * | 10/2012 | Kim et al. | 118/715 |
| 2003/0037879 A1 | 2/2003 | Askarinam et al. | |
| 2003/0049372 A1 * | 3/2003 | Cook et al. | 427/248.1 |
| 2003/0134136 A1 | 7/2003 | Biscotto et al. | |
| 2004/0099378 A1 * | 5/2004 | Kim et al. | 156/345.33 |
| 2004/0198153 A1 | 10/2004 | Halpin et al. | |
| 2004/0200417 A1 | 10/2004 | Hanawa et al. | |
| 2004/0216514 A1 | 11/2004 | Nunnally et al. | |
| 2005/0079735 A1 | 4/2005 | Higuchi et al. | |
| 2005/0178748 A1 * | 8/2005 | Buchberger et al. | 219/121.48 |
| 2005/0263719 A1 | 12/2005 | Ohdaira et al. | |
| 2005/0271814 A1 | 12/2005 | Chang et al. | |
| 2005/0277272 A1 | 12/2005 | Singh et al. | |
| 2006/0021574 A1 | 2/2006 | Armour et al. | |
| 2006/0078676 A1 | 4/2006 | Lukas et al. | |
| 2006/0112876 A1 * | 6/2006 | Choi et al. | 118/715 |
| 2006/0234504 A1 | 10/2006 | Bauer et al. | |
| 2007/0170148 A1 | 7/2007 | Kuppurao et al. | |
| 2008/0092812 A1 * | 4/2008 | McDiarmid et al. | 118/695 |
| 2008/0210163 A1 * | 9/2008 | Carlson et al. | 118/715 |
| 2009/0165713 A1 * | 7/2009 | Kim et al. | 118/719 |
| 2009/0260569 A1 * | 10/2009 | Kim et al. | 118/715 |
| 2009/0260572 A1 * | 10/2009 | Kim et al. | 118/730 |
| 2009/0274454 A1 * | 11/2009 | Aderhold et al. | 392/416 |
| 2009/0288604 A1 * | 11/2009 | Kim et al. | 118/726 |

FOREIGN PATENT DOCUMENTS

| | | | | |
|---|---|---|---|---|
| JP | H01-068476 | 3/1989 | | |
| JP | H01-091423 | 4/1989 | | |
| JP | H05-295549 | 11/1993 | | |
| JP | 2000114196 A | * | 4/2000 | H01L 21/26 |
| JP | 2005340665 | 12/2005 | | |

OTHER PUBLICATIONS

Zhiheng Liu, et al.; Desorption of H from Si(111) by Resonant Excitation of the Si—H Vibrational Stretch Mode; Science (May 19, 2006), pp. 1024-1026, vol. 312.

V. A. Levin, et al.; The initiation of a detonation process in H2—Cl2 Mixture; Arch. Thermodyn. Spal. (1978) 9(4):613-622.

Knox, Ferro; The H2+Cl2 Explosion as a Chemical Analogue of the Photoelectric Effect: A True Quantum Mechanical Demonstration; Journal of Chemical Education (1990) 67(10):897.

J. H. Lee, et al.; Photochemical Initiation of Gaseous Detonations; Acta Astronautica (1978) 5:971-982.

Niki, et al.; An FTIR Study of the Kinetics and Mechanism for the Cl- and Br-Atom-Initiated Oxidation of SiH$_4$; J. Phys. Chem. (1985) 89:1752-1755.

International Search Report and Written Opinion of the International Searching Authority for International Application No. PCT/US07/84482 mailed Jun. 5, 2008.

Notice of Rejection dtd Nov. 15, 2011 for Japanese Application No. 2009-537303.

* cited by examiner

INDEPENDENT RADIANT GAS PREHEATING FOR PRECURSOR DISASSOCIATION CONTROL AND GAS REACTION KINETICS IN LOW TEMPERATURE CVD SYSTEMS

CROSS-REFERENCE TO RELATED APPLICATIONS

This application is a divisional of U.S. patent application Ser. No. 11/937,388, filed Nov. 8, 2007 now U.S. Pat. No. 7,976,634, which claims benefit of U.S. Provisional Patent Application Ser. No. 60/866,799, filed Nov. 21, 2006, both of which are incorporated herein by reference.

BACKGROUND OF THE INVENTION

1. Field of the Invention

Embodiments of the present invention generally relate to preheating gases for a semiconductor fabrication process. More specifically, to preheating gases used in deposition and etch reactions on a semiconductor substrate, such as an epitaxial deposition process or other chemical vapor deposition process.

2. Description of the Related Art

Epitaxial growth of silicon and/or germanium-containing films has become increasingly important due to new applications for advanced logic and DRAM devices, among other devices. A key requirement for these applications is a lower temperature process so that device features will not be damaged during fabrication. The lower temperature process is also important for future markets where the feature sizes are in the range of 45 nm to 65 nm, and avoidance of the diffusion of adjacent materials becomes critical. Lower process temperatures may also be required for both substrate cleaning prior to growth of the silicon and/or germanium-containing epitaxial film and during selective or blanket growth of the epitaxial film. By selective growth, it is generally meant that the film grows on a substrate which includes more than one material on the substrate surface, wherein the film selectively grows on a surface of a first material of said substrate, with minimal to no growth on a surface of a second material of said substrate.

Selective and blanket (non-selectively grown) epitaxial films containing silicon and/or germanium, and strained embodiments of such epitaxial films, which are grown at temperatures of less than about 700° C., are required for many current semiconductor applications. Further, it may be desirable to have the removal of native oxide and hydrocarbons prior to formation of the epitaxial film accomplished at temperatures in the range of about 650° C. or less, although higher temperatures may be tolerated when the removal time period is shortened.

This lower temperature processing is not only important to forming a properly functioning device, but it minimizes or prevents the relaxation of metastable strain layers, helps to prevent or minimize dopant diffusion, and helps to prevent segregation of dopant within the epitaxial film structure. Suppression of facet formation and short channel effects, which is enabled by low temperature processing (low thermal budget processing), is a significant factor for obtaining high performance devices.

Current techniques for selective and blanket epitaxial growth of doped and undoped silicon (Si), germanium (Ge), SiGe, and carbon containing films, are typically carried out using reduced pressure chemical vapor deposition (CVD), which is also referred to as RPCVD or low pressure CVD (LPCVD). The typical reduced pressure process, such as below about 200 Torr, is carried out at temperatures above about 700° C., typically above 750° C., to get an acceptable film growth rate. Generally, the precursor compounds for film deposition are silicon and/or germanium containing compounds, such as silanes, germanes, combinations thereof or derivatives thereof. Generally, for selective deposition processes, these precursor compounds are combined with additional reagents, such as chlorine ($Cl_2$), hydrogen chloride (HCl), and optionally hydrogen bromide (HBr), by way of example. A carbon-containing silane precursor compound, for example methylsilane ($CH_3SiH_3$), may be used as a dopant. In the alternative, inorganic compounds, such as diborane ($B_2H_6$), arsine ($AsH_3$), and phosphine ($PH_3$), by way of example, may also be used as dopants.

In a typical LPCVD process to deposit an epitaxial layer on a substrate, precursors are injected into a processing region in a chamber by a gas distribution assembly, and the precursors are energized above the surface of a substrate in the chamber by irradiation of the precursors in the processing region, which is typically low wavelength radiation, such as in the ultraviolet and/or infrared spectrum. Plasma generation may also be used to dissociate the reactants. The substrate temperature is typically elevated to assist in adsorption of reactive species and/or desorption of process byproducts, and it is desirable to minimize the delta between the precursor temperature in the processing region and the substrate temperature in order to optimize the energization of the precursors and enhance the deposition or desorption process.

To enable a more efficient dissociation process, it is desirable to preheat the precursors prior to delivery to the processing region to enable faster and more efficient dissociation of the precursors above the substrate. Various methods to heat the precursors have been employed, but challenges remain in stabilizing the preheat temperature prior to energization above the substrate surface. For example, the precursor temperature may be elevated to a desired temperature at or before introduction to the gas distribution assembly, but the precursor temperature may be lowered by thermal losses in flowing through the gas distribution assembly and/or along the flow path to the processing region above the substrate.

Therefore, there is a need in the art for an apparatus and method to minimize the temperature range delta between the introduction temperature of precursors and the processing region, and an apparatus and method of preheating precursors at the gas introduction point that also minimizes heat loss prior to dissociation of the precursor.

SUMMARY OF THE INVENTION

Embodiments described herein relate to an apparatus and method for delivering a process gas to a processing region within a chamber.

In one embodiment, a deposition apparatus is provided. The deposition apparatus includes a chamber having a longitudinal axis, and a gas distribution assembly coupled to a sidewall of the chamber. The gas distribution assembly includes a plurality of plenums coupled to one or more gas sources, an energy source positioned to provide energy to each of the plurality of plenums, and a variable power source coupled to the energy source, wherein the gas distribution assembly provides a flow path through the chamber that is normal to the longitudinal axis of the chamber.

In another embodiment, a deposition apparatus is provided. The apparatus includes a chamber having a longitudinal axis, and a gas distribution assembly coupled to a sidewall of the chamber the gas distribution assembly includes an injection block having at least one inlet to deliver a precursor gas to a plurality of plenums from at least two gas sources, and at least one energy source positioned to provide energy to the precursor gas from one or both of the at least two gas sources and each of the plurality of plenums, wherein the gas distribution assembly provides a flow path through the chamber that is normal to the longitudinal axis of the chamber.

In another embodiment, a method of delivering a preheated precursor gas to a processing region in a chamber is described. The method includes providing a precursor gas to a gas distribution assembly in communication with the processing region, heating the precursor gas at the point of introduction in the gas distribution assembly using non-thermal energy, and maintaining at least a portion of the heat provided to the precursor gas along a flow path defined between the point of introduction and the processing region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
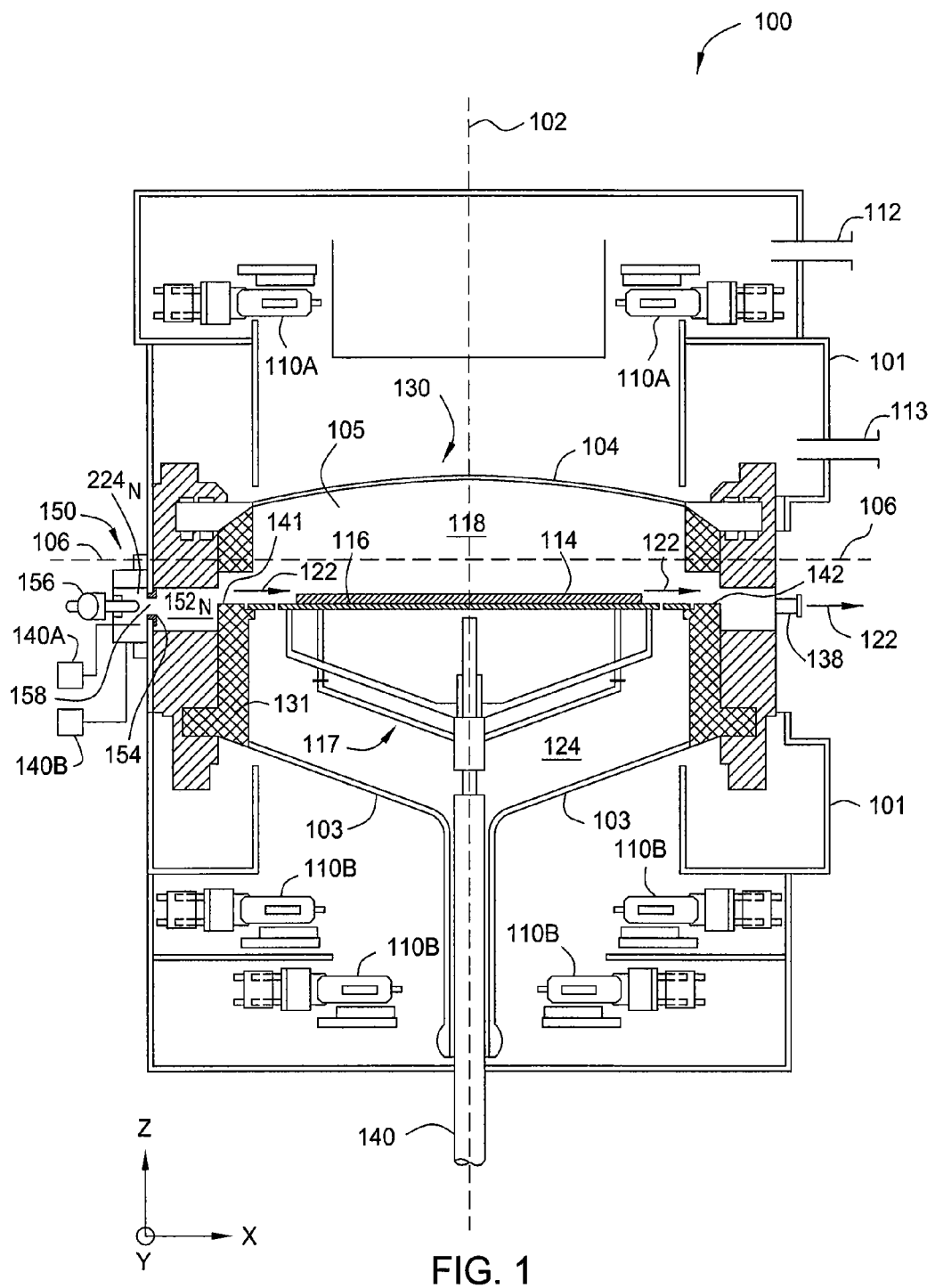
FIG. 1 is a schematic cross-sectional view of one embodiment of a deposition chamber.

To facilitate understanding, identical reference numerals have been used, wherever possible, to designate identical elements that are common to the figures. It is also contemplated that elements disclosed in one embodiment may be beneficially utilized on other embodiments without specific recitation.

DETAILED DESCRIPTION

FIG. 1 is a schematic cross-sectional view of a deposition chamber 100 configured for epitaxial deposition, which may be part of a CENTURA® integrated processing system available from Applied Materials, Inc., of Santa Clara, Calif. The deposition chamber 100 includes housing structure 101 made of a process resistant material, such as aluminum or stainless steel, for example 316 L stainless steel. The housing structure 101 encloses various functioning elements of the process chamber 100, such as a quartz chamber 130, which includes an upper chamber 105, and a lower chamber 124, in which a processing volume 118 is contained. Reactive species are provided to the quartz chamber 130 by a gas distribution assembly 150, and processing byproducts are removed from processing volume 118 by an outlet 138, which is typically in communication with a vacuum source (not shown).

A substrate support 117 is adapted to receive a substrate 114 that is transferred to the processing volume 118. The substrate support 117 is disposed along a longitudinal axis 102 of the deposition chamber 100. The substrate support may be made of a ceramic material or a graphite material coated with a silicon material, such as silicon carbide, or other process resistant material. Reactive species from precursor reactant materials are applied to surface 116 of the substrate 114, and byproducts may be subsequently removed from surface 116. Heating of the substrate 114 and/or the processing volume 118 may be provided by radiation sources, such as upper lamp modules 110A and lower lamp modules 110B.

In one embodiment, the upper lamp modules 110A and lower lamp modules 110B are infrared (IR) lamps. Non-thermal energy or radiation from lamp modules 110A and 110B travels through upper quartz window 104 of upper quartz chamber 105, and through the lower quartz portion 103 of lower quartz chamber 124. Cooling gases for upper quartz chamber 105, if needed, enter through an inlet 112 and exit through an outlet 113. Precursor reactant materials, as well as diluent, purge and vent gases for the chamber 100, enter through gas distribution assembly 150 and exit through outlet 138.

The low wavelength radiation in the processing volume 118, which is used to energize reactive species and assist in adsorption of reactants and desorption of process byproducts from the surface 116 of substrate 114, typically ranges from about 0.8 μm to about 1.2 μm, for example, between about 0.95 μm to about 1.05 μm, with combinations of various wavelengths being provided, depending, for example, on the composition of the film which is being epitaxially grown. In another embodiment, the lamp modules 110A and 110B may be ultraviolet (UV) light sources. In one embodiment, the UV light source, is an excimer lamp. In another embodiment, UV light sources may be used in combination with IR light sources in one or both of the upper quartz chamber 105 and lower quartz chamber 124. An example of UV radiation sources used in combination with IR radiation sources can be found in U.S. patent application Ser. No. 10/866,471, filed Jun. 10, 2004, which published on Dec. 15, 2005, as United States patent publication No. 2005/0277272, which is incorporated by reference in its entirety.

The component gases enter the processing volume 118 via gas distribution assembly 150. Gas flows from the gas distribution assembly 150 and exits through port 138 as shown generally at 122. Combinations of component gases, which are used to clean/passivate a substrate surface, or to form the silicon and/or germanium-containing film that is being epitaxially grown, are typically mixed prior to entry into the processing volume. The overall pressure in the processing volume 118 may be adjusted by a valve (not shown) on the outlet port 138. At least a portion of the interior surface of the processing volume 118 is covered by a liner 131. In one embodiment, the liner 131 comprises a quartz material that is opaque. In this manner, the chamber wall is insulated from the heat in the processing volume 118.

The temperature of surfaces in the processing volume 118 may be controlled within a temperature range of about 200° C. to about 600° C., or greater, by the flow of a cooling gas, which enters through a port 112 and exits through port 113, in combination with radiation from upper lamp modules 110A positioned above upper quartz window 104. The temperature in the lower quartz chamber 124 may be controlled within a temperature range of about 200° C. to about 600° C. or greater, by adjusting the speed of a blower unit which is not shown, and by radiation from the lower lamp modules 110B disposed below lower quartz chamber 124. The pressure in the processing volume 118 may be between about 0.1 Torr to about 600 Torr, such as between about 5 Torr to about 30 Torr.

The temperature on the substrate 114 surface 116 may be controlled by power adjustment to the lower lamp modules 1106 in lower quartz chamber 124, or by power adjustment to both the upper lamp modules 110A overlying upper quartz chamber 104, and the lower lamp modules 1108 in lower quartz chamber 124. The power density in the processing volume 118 may be between about 40 W/cm$^2$ to about 400 W/cm$^2$, such as about 80 W/cm$^2$ to about 120 W/cm$^2$.

In one aspect, the gas distribution assembly 150 is disposed normal to, or in a radial direction 106 relative to, the longitudinal axis 102 of the chamber 100 or substrate 114. In this orientation, the gas distribution assembly 150 is adapted to flow process gases in a radial direction 106 across, or parallel to, the surface 116 of the substrate 114. In one application, the process gases are preheated at the point of introduction to the chamber 100 to initiate preheating of the gases prior to introduction to the processing volume 118, and/or to break specific bonds in the gases. In this manner, surface reaction kinetics may be modified independently from the thermal temperature of the substrate 114.

Figure 2:
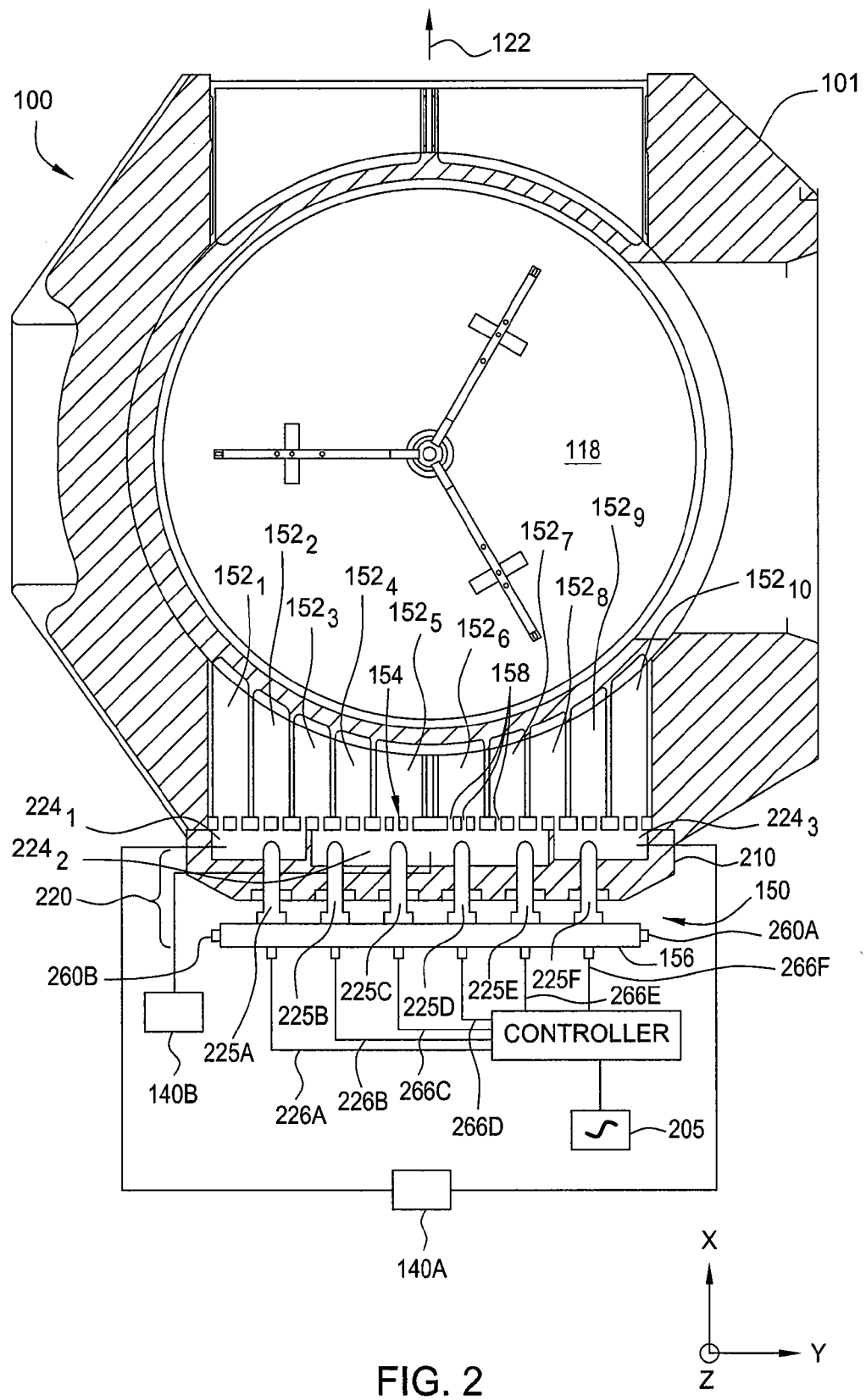
FIG. 2 is a schematic top view of a portion of the deposition chamber shown in FIG. 1.

FIG. 2 is a schematic top view of a portion of a deposition chamber 100 similar the chamber shown in FIG. 1, with the exception of the substrate 114 not being shown. A gas distribution assembly 150 is shown coupled to the housing structure 101. The gas distribution assembly 150 includes an injection block 210 coupled to one or more gas sources 140A and 140B. The gas distribution assembly 150 also includes a non-thermal heating assembly 220, which includes a plurality of radiant heat sources, such as IR lamps 225A-225F disposed at least partially in the injection block 210. The injection block 210 also includes one or more plenums $224_N$ disposed upstream of the openings 158 of a perforated plate 154, such as inner plenum $224_2$ and outer plenums $224_1$ and $224_3$, and the IR lamps 225A-225F are disposed at least partially in the plenums $224_N$.

Although six IR lamps are shown, the gas distribution assembly 150 may include more or less IR lamps. The IR lamps 225A-225F may include halogen type lamps, or rapid thermal processing (RTP) lamps with a wattage between about 300 watts to about 1200 watts, depending on the intensity of the radiation needed for the particular process, and/or the number of IR lamps used with the gas distribution assembly 150. In the embodiment shown, the IR lamps 225A-225F are RTP style lamps having a wattage between about 500 watts to about 750 watts, for example between about 500 watts to about 550 watts with about an 80 volt power application. In one application, the power density provided by each of the IR lamps 225A-225F may be between about 25 W/cm$^2$ to about 40 W/cm$^2$ in the plenums $224_N$. In one embodiment, the IR lamps 225A-225F provide a variable temperature in each plenum $224_N$ of about 50° C. to about 250° C.

In operation, precursors to form Si and SiGe blanket or selective films are provided to the gas distribution assembly 150 from the one or more gas sources 140A and 140B. The gas sources 140A, 140B may be coupled the gas distribution assembly 150 in a manner configured to facilitate introduction zones within the gas distribution assembly 150, such as an outer zone that is shown as outer plenums $224_1$ and $224_3$, and an inner zone, shown as inner plenum $224_2$. The gas sources 140A, 140B may include valves (not shown) to control the rate of introduction into the plenums $224_N$. Alternatively, the plenums $224_N$ may be in communication with one gas source, or other gas sources may be added to create more introduction zones.

The gas sources 140A, 140B may include silicon precursors such as silanes, including silane ($SiH_4$), disilane ($Si_2H_6$), dichlorosilane ($SiH_2Cl_2$), hexachlorodisilane ($Si_2Cl_6$), dibromosilane ($SiH_2Br_2$), higher order silanes, derivatives thereof, and combinations thereof. The gas sources 140A, 140B may also include germanium containing precursors, such as germane ($GeH_4$), digermane ($Ge_2H_6$), germanium tetrachloride ($GeCl_4$), dichlorogermane ($GeH_2Cl_2$), derivatives thereof, and combinations thereof. The silicon and/or germanium containing precursors may be used in combination with hydrogen chloride (HCl), chlorine gas ($Cl_2$), hydrogen bromide (HBr), and combinations thereof. The gas sources 140A, 140B may include one or more of the silicon and germanium containing precursors in one or both of the gas sources 140A, 140B. For example, the gas source 140A, which may be in communication with the outer plenums $224_1$ and $224_3$, may include precursor materials, such as hydrogen gas ($H_2$) or chlorine gas ($Cl_2$), while gas source 140B may include silicon and/or germanium containing precursors, derivatives thereof, or combinations thereof.

The precursor materials from the gas sources 140A, 140B are delivered to the plenums $224_N$ and the non-thermal energy from the IR lamps 225A-225F illuminates the precursor materials with IR energy in the plenums $224_N$ at the point of introduction. The wavelength of the non-thermal energy resonates and excites the precursor materials by taking advantage of the vibrational stretch mode of the precursor materials, and the energy is absorbed into the precursor materials, which preheats the precursor materials prior to entry into the processing volume. The injection block 210, which contains the IR lamps 225A-225F, is made of a material with high reflectivity, such as stainless steel, which may also include a polished surface to increase reflectivity. The reflective quality of the material for the injection block 210 may also act as an insulator to minimize heating of the injection block, thus increasing safety to personnel that may be in close proximity to the injection block 210. In one embodiment, the injection block 210 comprises stainless steel and the interior surfaces of the plenums $224_N$ are polished. In another embodiment, the injection block 210 comprises aluminum and the interior surfaces of the plenums $224_N$ are polished.

The precursor materials enter the processing volume 118 through openings 158 in the perforated plate 154 in this excited state, which in one embodiment is a quartz material, having the openings 158 formed therethrough. In this embodiment, the perforated plate is transparent to IR energy, and may be made of a clear quartz material. In other embodiments, the perforated plate 154 may be any material that is transparent to IR energy and is resistant to process chemistry and other process parameters. The energized precursor materials flow toward the processing volume 118 through a plurality of holes 158 in the perforated plate 154, and through a plurality of channels $152_N$. A portion of the photons and non-thermal energy from the IR lamps 225A-225F also passes through the holes 158, the perforated plate 154, and channels $152_N$, facilitated by the high reflective material and/or surface of the injection block 210, thereby illuminating the flow path of the precursor materials (shown as arrow 325 in FIG. 3). In this manner, the vibrational energy of the precursor materials may be maintained from the point of introduction to the processing volume 118 along the flow path.

Figure 6:
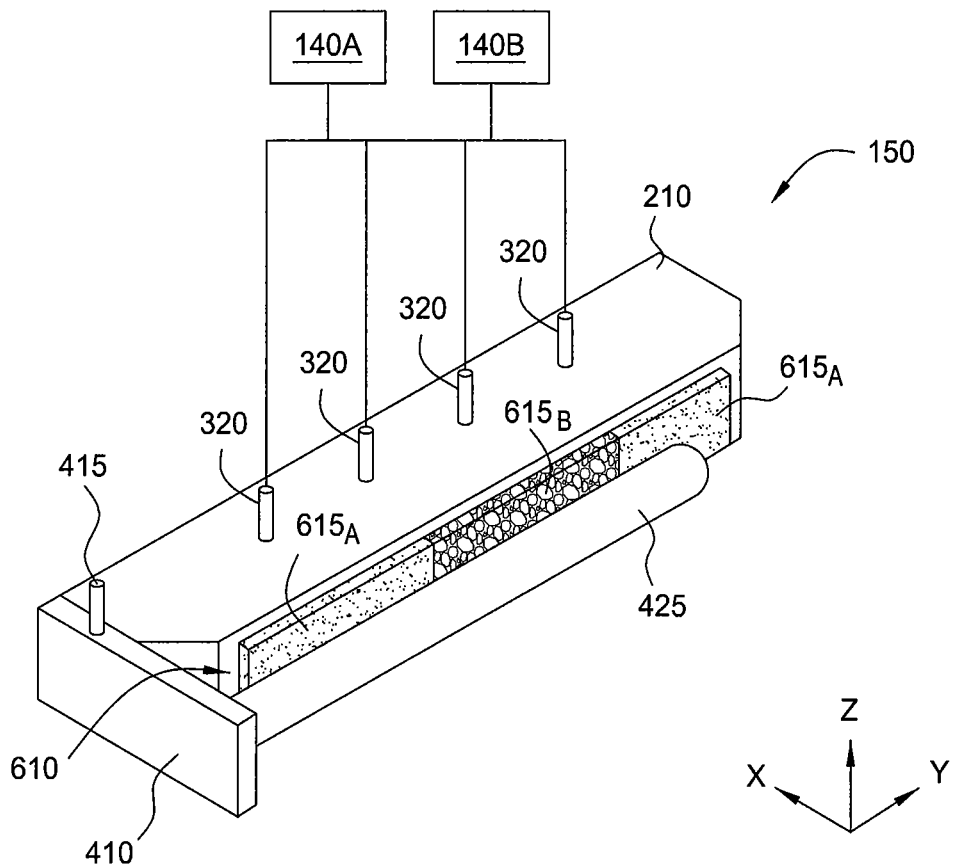
FIG. 6 is an isometric schematic view of another embodiment of a gas distribution assembly.

Intensity of the IR wavelengths in the plurality of IR lamps 225A-225F may be increased or decreased depending on the process. In one application, intensity of the IR lamps may be controlled by filter elements 405 (FIG. 4), and window 610 (FIG. 6). In another embodiment, a sheath 315 (FIG. 3) may be disposed over at least a portion of the IR lamps 225A-225F, and the sheath may be configured as a filter element to control the intensity of the lamps. In one example, the filter elements may be a sleeve, sheet, or lens adapted to modulate bandwidth by selective transmission of specific wavelengths. The filter elements may be used on at least one of the IR lamps 225A-225F or all of the IR lamps 225A-225F. Alternatively, different filter elements may be used on different IR lamps 225A-225F. In one example, the outer plenums $224_1$ and $224_3$ may receive a first level of intensity by using a first filter configured to absorb or block specific spectra, while the inner plenum $224_2$ receives a second level of intensity by using a second filter configured to absorb or block a different specific spectra.

In another application that may be used alone or in combination with filters, the IR intensity in the multiple zones defined by the plenums $224_N$ may be individually controlled by leads 226A-226F coupled to a power source 205 and a controller. For example, the outer plenums $224_1$ and $224_3$ may receive a first level of intensity, while the inner plenum $224_2$ receives a second level of intensity by variation of signals provided to the IR lamps 225A-225F. Alternatively, each IR lamp 225A-225F may be controlled separately by variation of signals provided by the controller. The intensity of the IR lamps 225A-225F may be controlled in an open-loop mode, or a closed-loop mode. Thus, the precursor materials enter the processing volume 118 in a preheated or energized state, which may lessen the adsorption or desorption time frame or disassociation time, which, in turn, increases throughput.

Figure 3:
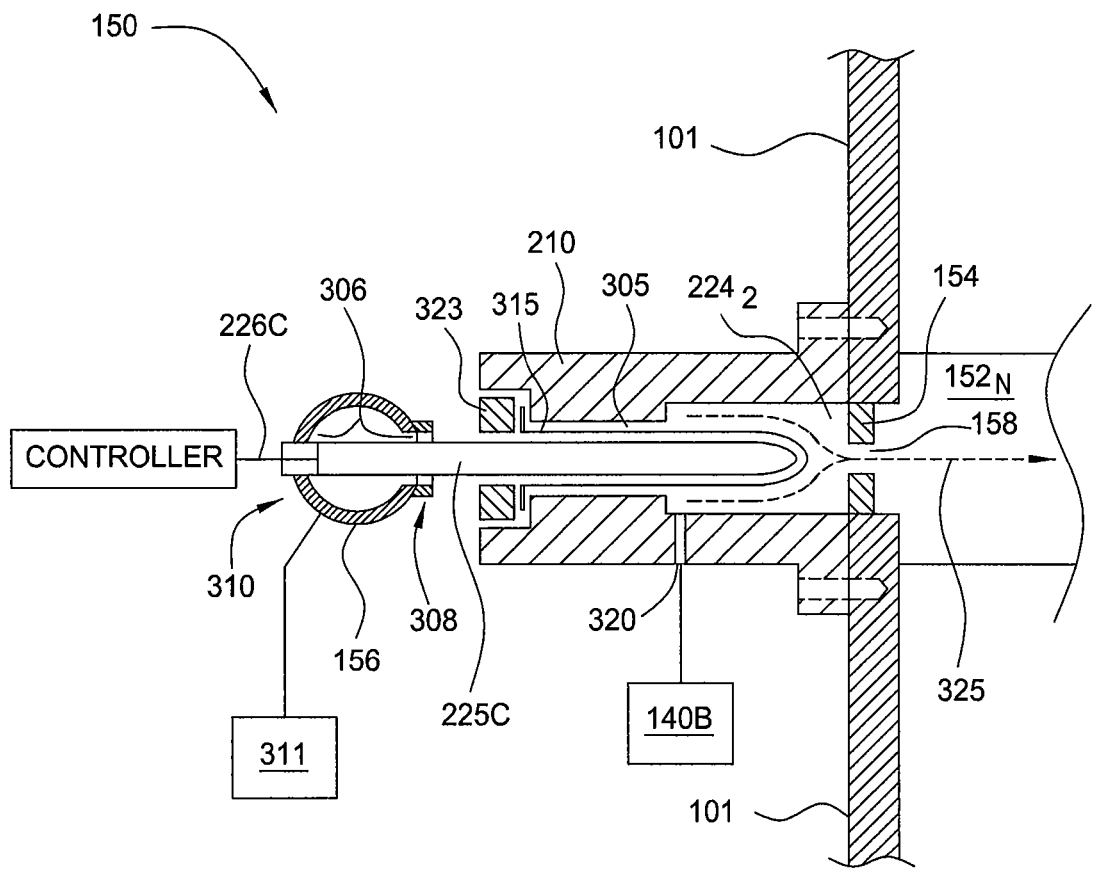
FIG. 3 is a schematic side view of one embodiment of a gas distribution assembly.

FIG. 3 is a schematic side view of one embodiment of a gas distribution assembly 150 as shown in FIGS. 1 and 2. An aperture 305 is formed in the injection block 210 to receive a portion of an IR lamp 225C, which is at least partially inserted into the plenum $224_2$. Precursor materials are supplied to the plenum $224_2$ by a port 320 disposed in the injection block 210. The aperture 305 may be sized slightly larger than the IR lamp 225C to allow space for a sheath 315 adapted to encase a portion of the IR lamp 225C. In one embodiment, the sheath 315 is made of a material transparent to IR energy, such as quartz, magnesium fluoride, calcium fluoride, sapphire, as examples. In another embodiment, the sheath 315 may be adapted as a filter element to modulate bandwidth by selective transmission of specific wavelengths. Temperature sensing devices (not shown), such as thermocouples, may be disposed in the injection block 210 to monitor the sheath temperature and/or the temperature in the plenum $224_2$. The aperture 305 also includes a larger diameter portion at the end opposite the plenum $224_2$ to receive a high temperature seal 323, for example an o-ring made of a polymeric material adapted to withstand elevated temperatures, such as a Teflon® material, polyethernitrile, polyetheretherketone (PEEK), polyaryletherketone (PAEK), among others.

Referring to FIGS. 2 and 3, the IR lamps 225A-225F are coupled to a cooling device 310 to cool the IR lamps 225A-225F. In one application, the cooling device 310 includes a conduit, such as a tubular member 156 having an inlet port 260A and an outlet port 260B, and is adapted to provide a coolant to a plurality of IR lamps 225A-225F. In other embodiments (not shown in FIGS. 2 and 3), the cooling device may be housing coupled to a single IR lamp. The cooling device 310 may comprise a cooling fluid, such as a liquid or gas from a coolant source 311 that circulates through the tubular member 156 to facilitate heat transfer from the IR lamps 225A-225F. The tubular member 156 also includes apertures 306 adapted to receive a portion of the IR lamps 225A-225F. At least one of the apertures includes a fitting 308, such as a stainless steel VCO fitting, adapted to receive a portion of the IR lamp and seal the tubular member 156. In one embodiment, the cooling fluid from the coolant source 311 is nitrogen gas, which is circulated through the tubular member 156.

In operation, in reference to FIG. 3, precursor materials from gas source 140B are introduced to the plenum $224_2$ by the port 320, and the precursor materials are radiantly heated by the IR lamp 225C at this point of introduction. The lower partial pressure in the processing volume 118 (not shown in this view) creates a flow path 325 through the opening 158 and the channel $152_N$. The precursor materials are energized in the plenum $224_2$ and remain energized along the flow path 325 by the non-thermal energy reflected and/or passing into the channel $152_N$. Thus, preheating of the precursor materials, and maintenance of the energized precursor materials, is enhanced. Using this non-thermal energy minimizes or eliminates the need for resistive or convective heating elements in or near the precursor introduction point, which may improve safety of the use of the chamber, and minimizes the need for extended cooling systems for the chamber.

Figure 4:
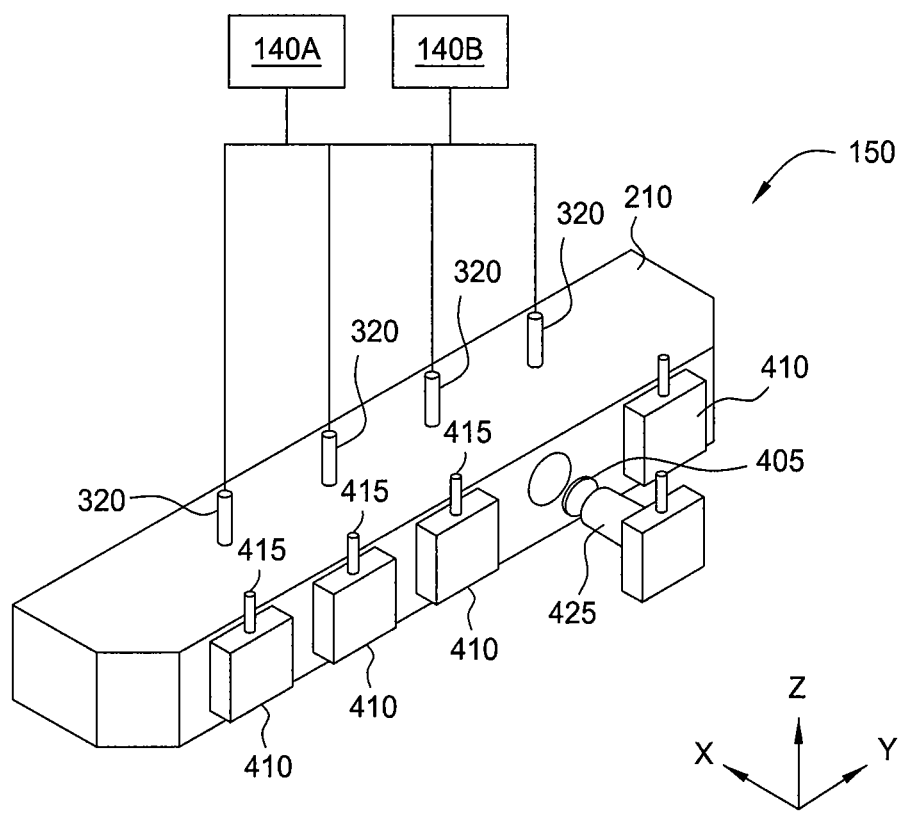
FIG. 4 is an isometric schematic view of another embodiment of a gas distribution assembly.
Figure 5:
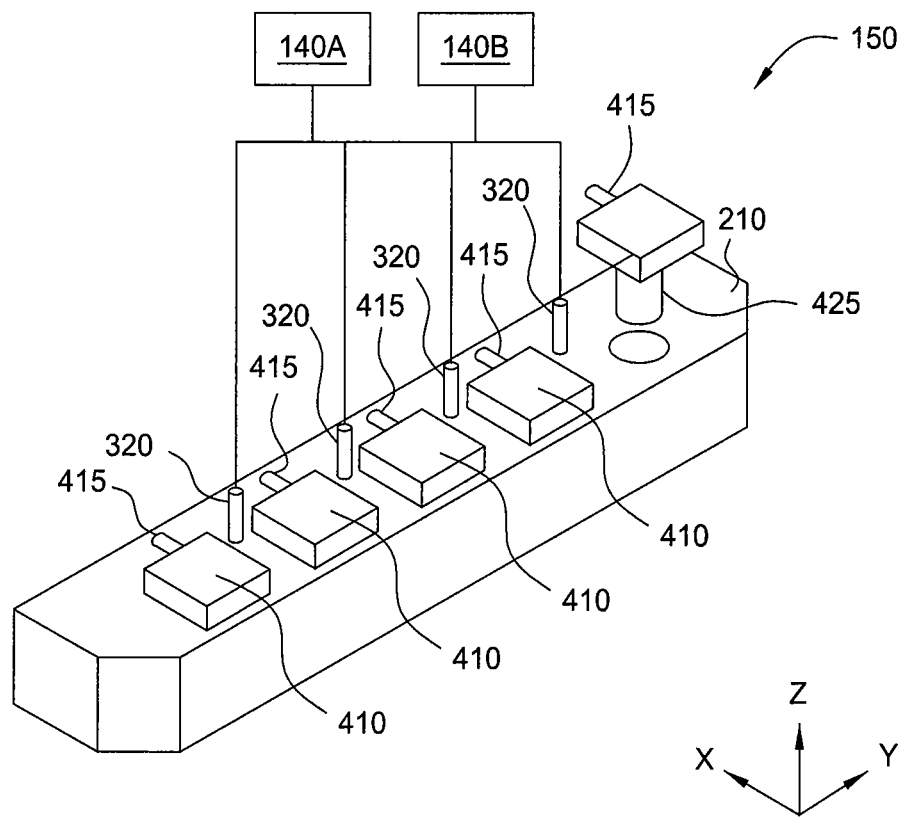
FIG. 5 is an isometric schematic view of another embodiment of a gas distribution assembly.

FIGS. 4-6 are isometric schematic views of various embodiments of a gas distribution assembly 150 that may be coupled with the chamber 100 of FIG. 1. The gas distribution assembly 150 includes an injection block 210 having at least one IR lamp 425 in communication with a gas source, such as gas source 140A and/or 140B coupled to ports 320. While not shown, each port is in communication with a plenum $224_N$ disposed within the gas injection block 210. In the embodiments depicted in FIGS. 4-6, each IR lamp 425 is individually coupled to the injection block 210 by a housing 410 that provides electrical connections (not shown) and cooling capabilities. In one embodiment, each housing 410 includes a port 415 that may be coupled to the coolant source 311 (FIG. 3). In one application, each port 415 functions as an inlet and an outlet for cooling fluid.

In the embodiment shown in FIG. 4, a plurality of IR lamps 425 are disposed in a radial direction to the chamber 100 (FIG. 1). In this embodiment, each IR lamp 425 is disposed normal to a gas injection path as defined by the directional orientation of the ports 320. Additionally, one or more IR lamps 425 may include a filter element 405 adapted to modulate bandwidth by selective transmission of specific wavelengths from the IR lamp 425. The filter element 405 may be a sheath, a plate, a sheet, or any article or device adapted block specific wavelengths.

In the embodiment shown in FIG. 5, a plurality of IR lamps 425 are disposed in a parallel orientation relative to the longitudinal axis of the chamber 100 (FIG. 1). In this embodiment, each IR lamp 425 is disposed substantially parallel to a gas injection path as defined by the directional orientation of the ports 320. While not shown, one or more IR lamps 425 may include a filter element (FIG. 4) adapted to modulate bandwidth by selective transmission of specific wavelengths from the IR lamp 425.

In the embodiment shown in FIG. 6, a single IR lamp 425 is disposed in a radial direction to the chamber 100 (FIG. 1). In this embodiment, the IR lamp 425 is disposed normal to a gas injection path as defined by the directional orientation of the ports 320. Additionally, the gas injection block 210 may include a plate 610 positioned between the IR lamp 425 and plenums $224_N$ (not shown in this view). In one embodiment, the plate 610 may be configured as a window made of a material that is transparent to IR light. In another embodiment, the plate 610 may be configured as a filter element adapted to modulate bandwidth by selective transmission of specific wavelengths from the IR lamp 425. In yet another embodiment, the plate 610 may be adapted as a filter element having multiple zones 615A, 615B adapted block specific wavelengths in each zone.

EXAMPLES

In one example, a blanket SiGe film was formed on a 300 mm wafer in the chamber 100 using the gas distribution assembly 150 as shown in FIG. 2. The chamber was provided with a pressure of about 10 Torr and a surface temperature in the processing region 118 of about 750° C. with a power density of about 45 W/cm². Dichlorosilane and germane was introduced to the processing region 118 from the gas distribution assembly 150 at about 0.5% and 0.01%, respectively. Non-thermal energy from the IR lamps 225A-225F operating at a power of about 30 watts produced a temperature measured at the sheath 315 of about 138° C. This produced a noticeable decrease in film growth rate and an increase in the percentage of germanium in the film.

In another example, a selective SiGe film was formed on a 300 mm wafer in the chamber 100 using the gas distribution assembly 150 as shown in FIG. 2. The chamber was provided with a pressure of about 10 Torr and a surface temperature in the processing region 118 of about 750° C. with a power density of about 45 W/cm². Dichlorosilane and germane was introduced to the processing region 118 from the gas distribution assembly 150 at about 0.5% and 0.01%, respectively. Hydrogen chloride was also provided at about 0.5%. Non-thermal energy from the IR lamps 225A-225F operating at a power of about 30 watts produced a temperature measured at the sheath 315 of about 138° C. This produced a significant decrease in film growth rate and an improved film profile.

In another example, a selective SiGe film was formed on a 300 mm wafer in the chamber 100 using the gas distribution assembly 150 as shown in FIG. 2. The chamber was provided with a pressure of about 10 Torr and a surface temperature in the processing region 118 of about 750° C. with a power density of about 45 W/cm². Silane and hydrogen chloride was introduced to the processing region 118 from the gas distribution assembly 150 at about 0.25% and 1.125%, respectively. Non-thermal energy from the IR lamps 225A-225F operating at a power of about 25 watts produced a temperature measured at the sheath 315 of about 110° C. This produced a noticeable increase in percentage of germanium in the film and a decrease in film growth rate.

In another example, a selective SiGe film was formed on a 300 mm wafer in the chamber 100 using the gas distribution assembly 150 as shown in FIG. 2. The chamber was provided with a pressure of about 10 Torr and a surface temperature in the processing region 118 of about 750° C. with a power density of about 45 W/cm². Silane and germane was introduced to the processing region 118 from the gas distribution assembly 150 at 0.25% and 1.225%, respectively. Hydrogen chloride was also provided at about 0.575%. Non-thermal energy from the IR lamps 225A-225F operating at a power of about 25 watts produced a temperature measured at the sheath 315 of about 110° C. This produced a significant decrease in film growth rate (about 56.5 Å/minute) and an increase in the percentage of germanium in the film (about 0.25%).

While the foregoing is directed to embodiments of the present invention, other and further embodiments of the invention may be devised without departing from the basic scope thereof, and the scope thereof is determined by the claims that follow.

The invention claimed is:

1. A deposition apparatus, comprising:
   a chamber having a longitudinal axis; and
   a gas distribution assembly coupled to a sidewall of the chamber, the gas distribution assembly providing a flow path through the chamber that is substantially normal to the longitudinal axis of the chamber and comprising:
   a plurality of plenums;
   a perforated plate bounding at least one side of each of the plurality of plenums;
   an energy source positioned to direct energy to each of the plurality of plenums; and
   a variable power source coupled to the energy source.

2. The apparatus of claim 1, wherein the energy source is an infrared lamp.

3. The apparatus of claim 1, wherein the energy source is a plurality of infrared lamps and at least one of the plurality of infrared lamps is at least partially disposed in each plenum.

4. The apparatus of claim 1, wherein the energy source is a plurality of infrared lamps and the variable power source comprises a multi-zone power source coupled to each of the infrared lamps.

5. The apparatus of claim 1, wherein at least a portion of the plurality of plenums comprise an inner zone and an outer zone and energy to each zone is independently controlled.

6. The apparatus of claim 1, wherein the gas distribution assembly comprises a quartz material that is transparent to infrared light.

7. The apparatus of claim 1, wherein the perforated plate is positioned downstream of the plurality of plenums.

8. The apparatus of claim 7, wherein the perforated plate comprises a transparent material.

9. The apparatus of claim 1, wherein each energy source is coupled to a coolant source.

10. The apparatus of claim 1, further comprising:
    a filter element positioned to block a portion of the energy from the energy source.

11. A deposition apparatus, comprising:
    a chamber having a longitudinal axis; and
    a gas distribution assembly coupled to a sidewall of the chamber, the gas distribution assembly comprising:
    an injection block having at least one inlet to deliver a precursor gas to a plurality of plenums from at least two gas sources;
    a perforated plate bounding at least one side of each of the plurality of plenums; and
    at least one energy source positioned to provide energy to the precursor gas from one or both of the at least two gas sources and each of the plurality of plenums, wherein the gas distribution assembly provides a flow path through the chamber that is normal to the longitudinal axis of the chamber.

12. The apparatus of claim 11, wherein the perforated plate is positioned downstream of the plurality of plenums.

13. The apparatus of claim 11, further comprising:
    a coolant source in communication with the at least one energy source.

14. The apparatus of claim 11, wherein the energy source is a plurality of infrared lamps and at least one of the plurality of infrared lamps is at least partially disposed in each plenum.

15. A deposition apparatus, comprising:
    a chamber having a longitudinal axis; and
    a gas distribution assembly coupled to a sidewall of the chamber, the gas distribution assembly providing a flow path through the chamber that is substantially normal to the longitudinal axis of the chamber and comprising:
    a plurality of plenums;
    a perforated plate bounding at least one side of each of the plurality of plenums and positioned downstream of the plurality of plenums;
    an energy source positioned to provide energy to each of the plurality of plenums; and
    a variable power source coupled to the energy source.

16. The apparatus of claim 15, wherein the energy source is an infrared lamp.

17. The apparatus of claim 15, wherein the energy source is a plurality of infrared lamps and at least one of the plurality of infrared lamps is at least partially disposed in each plenum.

18. The apparatus of claim 15, wherein the energy source is a plurality of infrared lamps and the variable power source comprises a multi-zone power source coupled to each of the infrared lamps.

19. The apparatus of claim 15, wherein at least a portion of the plurality of plenums comprise an inner zone and an outer zone and energy to each zone is independently controlled.

20. The apparatus of claim 15, wherein the gas distribution assembly comprises a quartz material that is transparent to infrared light.

21. The apparatus of claim 15, wherein the gas distribution assembly further includes a plurality of channels positioned downstream from the perforated plate in fluid communication with at least one of the plurality of plenums.

* * * * *

UNITED STATES PATENT AND TRADEMARK OFFICE
CERTIFICATE OF CORRECTION

PATENT NO. : 8,663,390 B2  
APPLICATION NO. : 13/175499  
DATED : March 4, 2014  
INVENTOR(S) : Carlson et al.

Page 1 of 1

It is certified that error appears in the above-identified patent and that said Letters Patent is hereby corrected as shown below:

In the Specification:

Column 4, Line 11, please delete "1106" and insert --110B-- therefor;

Column 4, Line 12, please delete "1108" and insert --110B-- therefor;

Column 4, Line 30, please delete "1108" and insert --110B-- therefor;

Column 4, Line 64, please delete "1106" and insert --110B-- therefor;

Column 5, Line 3, please delete "1106" and insert --110B-- therefor;

Column 5, Line 5, please delete "1108" and insert --110B-- therefor;

In the Claims:

Column 10, Claim 1, Line 1, please delete "positioned to direct energy to each" and insert --at least partially disposed in one-- therefor;

Column 10, Claim 11, Line 39, please insert --partially disposed in at least one of the plurality of plenums and-- after source;

Column 10, Claim 15, Line 63, please delete "to provide energy to each" and insert --at least partially in one-- therefor.

Signed and Sealed this  
Eighth Day of July, 2014

Michelle K. Lee  
*Deputy Director of the United States Patent and Trademark Office*